United States Patent
Zhao

(10) Patent No.: US 10,361,283 B2
(45) Date of Patent: Jul. 23, 2019

(54) MOS TRANSISTOR AND FABRICATION METHOD

(71) Applicant: Semiconductor Manufacturing International (Shanghai) Corporation, Shanghai (CN)

(72) Inventor: Meng Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/217,550

(22) Filed: Jul. 22, 2016

(65) Prior Publication Data

US 2016/0329412 A1   Nov. 10, 2016

Related U.S. Application Data

(63) Continuation of application No. 14/177,403, filed on Feb. 11, 2014, now Pat. No. 9,431,516.

(30) Foreign Application Priority Data

Mar. 28, 2013  (CN) .......................... 2013 1 0106691

(51) Int. Cl.
*H01L 29/66*        (2006.01)
*H01L 21/66*        (2006.01)
(Continued)

(52) U.S. Cl.
CPC .. *H01L 29/66598* (2013.01); *H01L 21/26586* (2013.01); *H01L 29/0847* (2013.01);
(Continued)

(58) Field of Classification Search
CPC . H01L 29/66; H01L 29/6656; H01L 29/0847; H01L 29/66636; H01L 29/7833;
(Continued)

(56) References Cited

U.S. PATENT DOCUMENTS 5,171,700 A     12/1992  Zamanian
5,675,166 A *  10/1997  Ilderem ............... H01L 29/0847
                                                              257/345
(Continued)

*Primary Examiner* — Marcos D. Pizarro
*Assistant Examiner* — Lawrence C Tynes, Jr.
(74) *Attorney, Agent, or Firm* — Anova Law Group, PLLC

(57) ABSTRACT

MOS transistors and fabrication methods are provided. An exemplary MOS transistor includes a gate structure formed on a semiconductor substrate. A lightly doped region is formed by a light ion implantation in the semiconductor substrate on both sides of the gate structure. A first halo region is formed by a first halo implantation to substantially cover the lightly doped region in the semiconductor substrate. A groove is formed in the semiconductor substrate on the both sides of the gate structure. Prior to forming a source and a drain in the groove, a second halo region is formed in the semiconductor substrate by a second halo implantation performed into a groove sidewall that is adjacent to the gate structure. The second halo region substantially covers the lightly doped region in the semiconductor substrate and substantially covers the groove sidewall that is adjacent to the gate structure.

11 Claims, 5 Drawing Sheets

(51) Int. Cl.
*H01L 29/08* (2006.01)
*H01L 29/78* (2006.01)
*H01L 21/265* (2006.01)

(52) U.S. Cl.
CPC .... *H01L 29/6656* (2013.01); *H01L 29/66636* (2013.01); *H01L 29/7833* (2013.01); *H01L 29/7848* (2013.01)

(58) Field of Classification Search
CPC ............... H01L 29/7848; H01L 21/265; H01L 21/26586
USPC .......................................................... 257/336
See application file for complete search history.

(56) References Cited

U.S. PATENT DOCUMENTS

| | | | | |
|---|---|---|---|---|
| 5,937,293 | A * | 8/1999 | Lee | .................. H01L 21/26586 257/336 |
| 6,589,847 | B1 | 7/2003 | Kadosh et al. | |
| 6,630,385 | B1 * | 10/2003 | Yu | ..................... H01L 21/26506 438/289 |
| 7,176,095 | B1 * | 2/2007 | Sultan | ............... H01L 21/26586 257/206 |
| 2002/0072176 | A1 * | 6/2002 | Park | .................. H01L 21/26506 438/286 |
| 2005/0001297 | A1 | 1/2005 | Kotani | |
| 2007/0196988 | A1 | 8/2007 | Shroff et al. | |
| 2008/0023761 | A1 | 1/2008 | Jung et al. | |
| 2010/0090281 | A1 | 4/2010 | Meneghesso et al. | |
| 2010/0102365 | A1 | 4/2010 | Shima | |
| 2010/0308379 | A1 | 12/2010 | Kuan et al. | |
| 2011/0309447 | A1 * | 12/2011 | Arghavani | ...... H01L 21/823412 257/368 |
| 2012/0205734 | A1 * | 8/2012 | Horch | ............... H01L 29/42324 257/315 |
| 2013/0069123 | A1 | 3/2013 | Illgen et al. | |
| 2013/0130458 | A1 | 5/2013 | Lee | |

* cited by examiner

MOS TRANSISTOR AND FABRICATION METHOD

CROSS REFERENCE TO RELATED APPLICATIONS

This application is a continuation of U.S. patent application Ser. No. 14/177,403, filed on Feb. 11, 2014, which claims priority to Chinese Patent Application No. CN201310106691.9, filed on Mar. 28, 2013, the entire contents of all of which are incorporated herein by reference.

FIELD OF THE DISCLOSURE

The present disclosure generally relates to the field of semiconductor manufacturing technology and, more particularly, relates to MOS transistors and fabrication methods.

BACKGROUND

With advances of semiconductor technology and increasing of integration degree of integrated circuits (ICs), device dimensions are increasingly reduced. The increasingly reduced device dimensions often adversely affect device performance. For instance, as channel lengths are reduced to a certain level, short channel effects may occur. This often results in decrease of carrier mobility, increase of threshold voltage, and occurrence of drain induction barrier lower (DIBL).

In a conventional MOS fabrication process, a lightly doped source/drain (LDD) process and a halo implantation process are usually employed to form S/D regions of a semiconductor transistor in order to suppress the short channel effect.

FIGS. 1-3 depict a conventional method for forming a MOS transistor. Referring to FIG. 1, a semiconductor substrate 10 is provided. A gate structure 20 is formed on the semiconductor substrate 10. The gate structure 20 includes a gate dielectric layer 21 on the surface of the semiconductor substrate 10 and a gate 22 on the surface of the gate dielectric layer 21.

Referring to FIG. 2, an offset spacer 23 is formed on surface of sidewalls of the gate structure 20. A light ion implantation process is conducted using the offset spacer 23 and the gate structure 20 as a mask to form lightly doped regions 31 in the semiconductor substrate 10 on both sides of the gate structure 20. A halo implantation region 32 can be formed by a halo ion implantation surrounding the lightly doped region 31.

Referring to FIG. 3, a sidewall spacer 24 is formed on surface of the offset spacer 23. The semiconductor substrate 10 is then etched to form a groove therein using the gate structure 20, the offset spacer 23, and the sidewall spacer 24 as an etch mask. When a PMOS transistor is to be formed, a germanium-silicon layer is formed in the groove. When an NMOS transistor is to be formed, a silicon carbide layer is formed in the groove. A source/drain implantation process is then carried out to form source/drain 40.

However, use of conventional technology to form MOS transistors may cause source-drain punch-through effect and DIBL to occur, which adversely affects performance and reliability of the formed MOS transistors.

BRIEF SUMMARY OF THE DISCLOSURE

An aspect of the present disclosure includes a method for forming a MOS transistor. A gate structure is formed on a semiconductor substrate. A lightly doped region is formed by a light ion implantation in the semiconductor substrate on both sides of the gate structure. A first halo region is formed by a first halo implantation to enclose the lightly doped region in the semiconductor substrate. A groove is formed in the semiconductor substrate on the both sides of the gate structure. Prior to forming a source and a drain in the groove, a second halo region is formed in the semiconductor substrate by a second halo implantation performed into a sidewall of the groove that is adjacent to the gate structure. The second halo region surrounds the lightly doped region in the semiconductor substrate and covers the sidewall of the groove that is adjacent to the gate structure. The source and the drain are formed in the groove.

Another aspect of the present disclosure includes a MOS transistor. The MOS transistor includes a semiconductor substrate and a gate structure disposed on the semiconductor substrate. A lightly doped region is disposed in the semiconductor substrate on both sides of the gate structure. A first halo region encloses the lightly doped region in the semiconductor substrate. A source and a drain are disposed in the semiconductor substrate and on the both sides of the gate structure. A second halo region is disposed in the semiconductor substrate to surround the lightly doped region in the semiconductor substrate and is connected to a sidewall of each of the source and the drain, the sidewall being adjacent to the gate structure.

Other aspects of the present disclosure can be understood by those skilled in the art in light of the description, the claims, and the drawings of the present disclosure.

DETAILED DESCRIPTION

Figure 1:
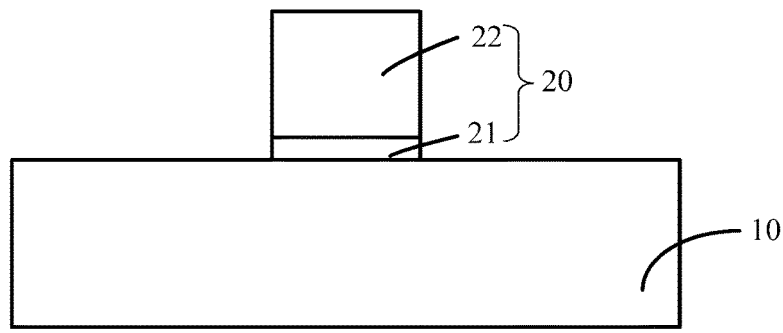
FIGS. 1-3 depict a conventional method for forming a PMOS transistor.
Figure 2:
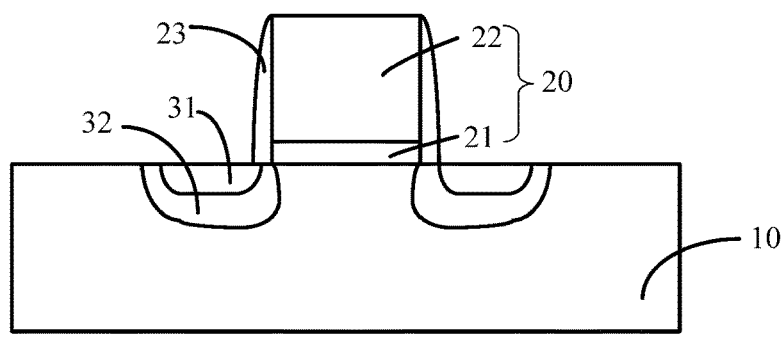
Figure 3:
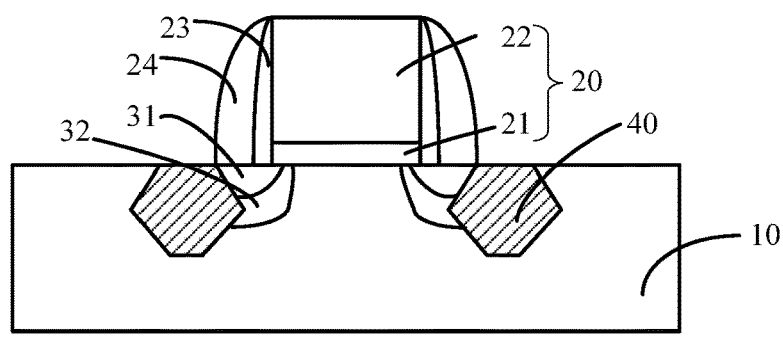

Reference will now be made in detail to exemplary embodiments of the disclosure, which are illustrated in the accompanying drawings. Wherever possible, the same reference numbers will be used throughout the drawings to refer to the same or like parts.

As discussed, source-drain punch-through effect and drain induction barrier lower (DIBL) can adversely affect performance and reliability of MOS transistors. For example, a SiGe or SiC process is often used to form the source/drain (source/drain) of a conventional transistor after forming the lightly doped region and the halo region of the transistor. Severe short channel effect may occur. These issues cannot be solved by adjusting process parameters during the light ion implantation process and the halo implantation process.

Since the halo implantation is implanted with an angle, when the implantation energy is too high, the edge of the gate dielectric layer can be damaged to affect the performance of transistor. As the transistor shrinks, the angle for the halo implantation cannot be too large. In addition, increasing implantation energy for the halo implantation does not provide desired improvement on the short channel effect. Increasing depth of the halo implantation may improve the source-drain punch-through effect. However, the increased depth may reduce concentration in the halo region at the shallow surface and may increase the punch-through effect near the lightly doped region of the source/drain. Thus, the punch-through effect of the source/drain cannot be reduced by increasing the implantation depth and energy of the halo implantation.

Further, the source/drain of transistor can be doped with impurity ions, which may diffuse into the channel region in the heat treatment for a subsequent epitaxial process and in an annealing treatment after forming the source/drain. A groove is formed by etching the semiconductor substrate during formation of source/drain of the transistor. Such etching process may inevitably remove a portion of the previously-formed halo region to decrease the halo area and thus reduce the diffusion barrier effect on ions doped in the source/drain. Even further, the depth of the formed source/drain is greater than the depth of the halo region. After a portion of the halo region is etched, a sidewall portion of the groove near the channel region is not covered or enclosed by the halo region. The subsequently-formed impurity ions in the source/drain may be easily to be diffused into the channel region through the sidewall portion of the groove that is not completely covered by the halo region, causing source-drain punch-through and other short channel effects.

The present disclosure discloses MOS transistors and their fabrication methods. After forming grooves for source/drain regions and before forming the source/drain regions, a second halo implantation process can be used to form a second halo region. The second halo region can be used as a barrier region to prevent/block the doped ions from being diffused from the source/drain regions to suppress the source-drain punch-through effect to improve transistor performance.

Figure 10:
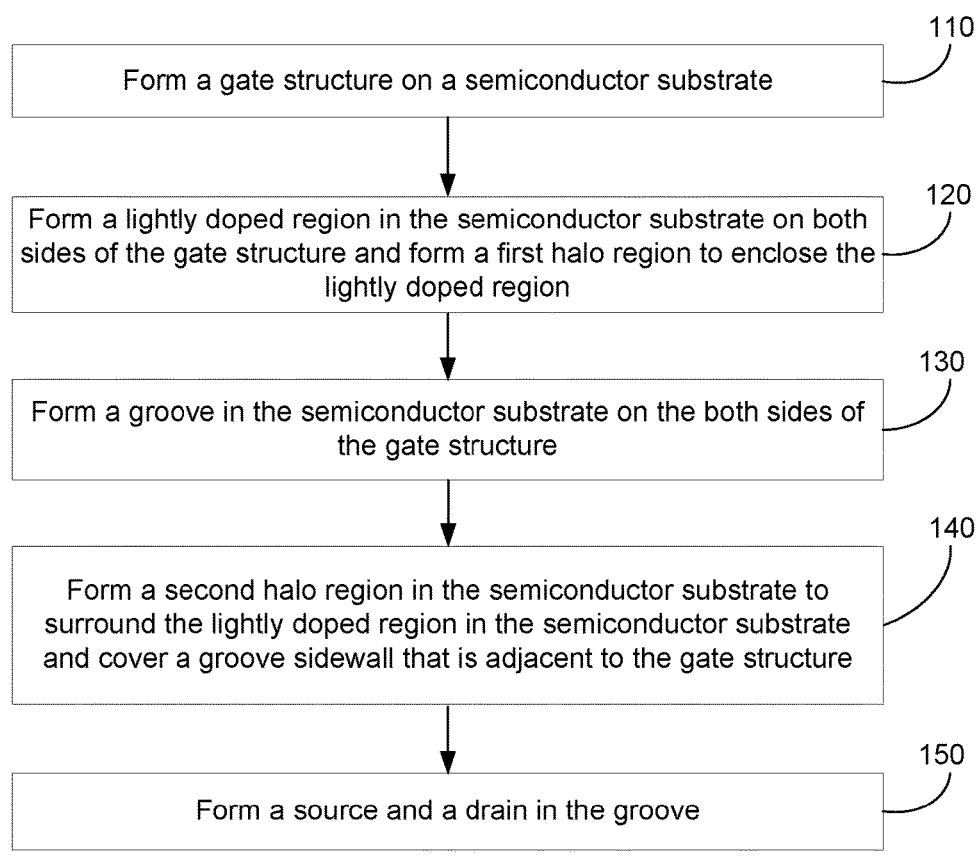
FIG. 10 depicts an exemplary method for forming a MOS transistor consistent with the disclosed embodiments.

FIGS. 4-8 depict an exemplary MOS transistor at various stages during its formation, and FIG. 10 depicts an exemplary method for forming a MOS transistor consistent with the disclosed embodiments.

Figure 4:
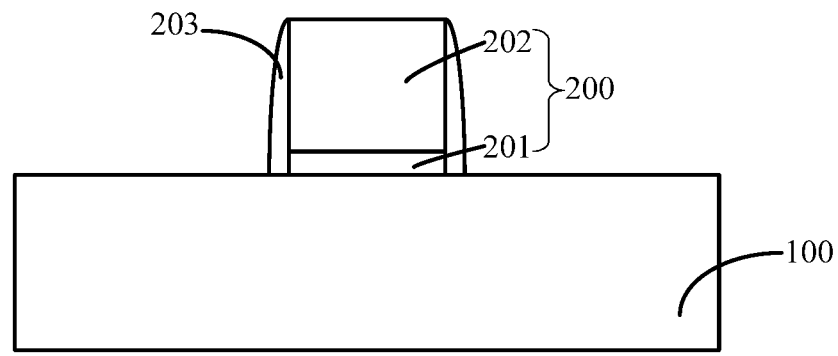
FIGS. 4-8 depict an exemplary MOS transistor at various stages during its formation consistent with the disclosed embodiments.

Referring to FIG. 4, a semiconductor substrate 100 is provided. A gate structure 200 is formed on the semiconductor substrate 100 (e.g., Step 110 of FIG. 10). The gate structure 200 includes a gate dielectric layer 201 formed on the semiconductor substrate 100 and a gate 202 formed on surface of the gate dielectric layer 201. Offset spacers are formed on surface of sidewalls of the gate structure 200.

The semiconductor substrate can be made of silicon, silicon germanium, or silicon-on-insulator. In an exemplary embodiment, the semiconductor substrate 100 is made of silicon. The type of semiconductor substrate can be determined according to a semiconductor device (e.g., a MOS transistor) to be formed and is not limited in accordance with various embodiments. In an exemplary embodiment, the semiconductor substrate 100 is a silicon substrate with a (100) crystal plane.

The gate dielectric layer 201 is made of silicon oxide or high-k materials, and the gate 202 is made of polysilicon, doped polysilicon, or metal. The offset spacers 203 are made of dielectric materials such as silicon oxide, silicon nitride, etc. The offset spacers are used as a mask for a subsequent light ion implantation and halo implantation to protect the gate dielectric layer 201 and the gate 202 from being damaged. In addition, the thickness of the offset spacer 203 can be used to adjust a distance between the lightly doped region/halo region and the gate structure.

Figure 5:
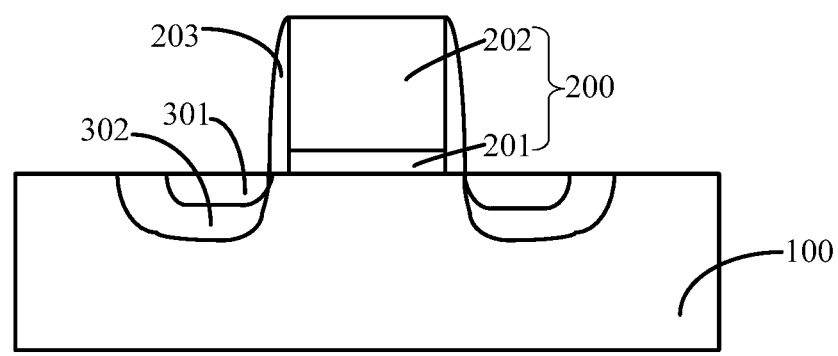

Referring to FIG. 5, a light ion implantation and a first halo implantation are performed on both sides of the gate structure 200 to form a lightly doped region 301, and a first halo region 302 enclosing or covering the lightly doped region 301 in the semiconductor substrate 100 (e.g., Step 120 of FIG. 10).

When a PMOS transistor is to be formed, ions for the light ion implantation can be P-type ions or carbon ions. The P-type ions can include B, In, etc. When an NMOS transistor is to be formed, ions for the light ion implantation can include N-type ions including, e.g., As, P, etc. The lightly doped region 301 can be formed by, e.g., implanting ions into the semiconductor substrate 100 on the both sides of the gate structure 200 utilizing the gate structure 200 and the offset spacers 203 as a mask.

The light ion implantation can be performed using an ion implanting dose ranging from about 1E14 atom/cm$^2$ to about 1E15 atom/cm$^2$ with ion implanting energy ranging from about 0.5 KeV to about 4 KeV at an inclined angle ranging from about 0 degree to about 15 degrees.

In an exemplary embodiment, after forming the lightly doped region 301 by the light ion implantation, a first halo region 302 enclosing or covering the lightly doped region 301 can be formed in the semiconductor substrate 100 by the first halo implantation on the both sides of the gate structure 200, using the gate structure 200 and the offset spacers 203 as a mask for the first halo implantation.

When a PMOS transistor is to be formed, ions used for the first halo implantation can be N-type ions such as As, P, etc. When an NMOS transistor is to be formed, ions used for the first halo implantation can include C ions or P-type ions such as B, In, etc. The ion implanting energy for the first halo implantation ranges from about 15 KeV to about 60 KeV, the ion implanting dose ranges from about 3E13 atom/cm$^2$ to about 6E13 atom/cm$^2$, and the inclined angle of ion implantation ranges from 25 degrees to 35 degrees.

The first halo region 302 and the lightly doped region 301 can be doped having an opposite conductivity type such that the depletion region of the lightly doped region near beneath the gate structure can become narrow to mitigate short channel effect.

In other embodiments, the first halo implantation can be first performed to form the first halo region 302, followed by the light ion implantation to form the lightly doped region 301.

After forming the lightly doped region 301 and the first halo region 302, a first annealing can be conducted, and simultaneously, the doped ions in the lightly doped region 301 and the halo region 302 can be activated. In this manner, annealing to activate the lightly doped region 301 and the first halo region 302 after forming the first halo region 302 can prevent the doped ions from being largely diffused from the lightly doped region 301 into the channel region during the annealing, to avoid shortening of the channel length or to avoid occurring of punch-through. An annealing temperature can range from about 900° C. to about 1100° C., and the annealing duration ranges from about 10 seconds to about 60 seconds.

In other embodiments, the first annealing can be performed after each of the light ion implantation and the first halo implantation, during the formation of the lightly doped region 301 and the first halo region 302. In yet other embodiments, the first halo implantation may not be performed, and only the lightly doped region 301 can be formed.

Figure 6:
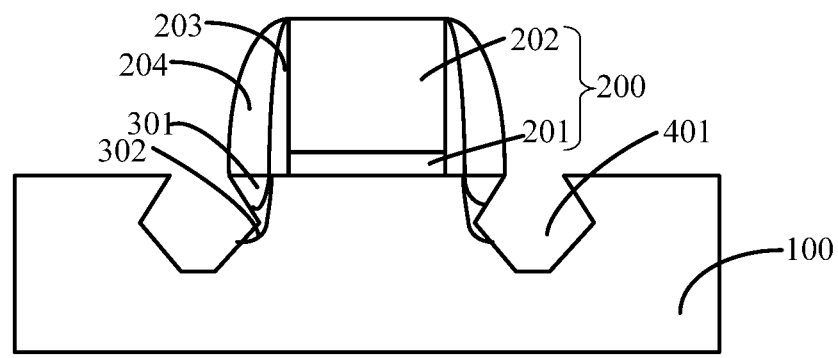

Referring to FIG. 6, sidewall spacers 204 are formed on surface of the offset spacers 203. The sidewall spacers 204, the offset spacers 230, and the gate structure 200 can be used as an etch mask to etch the semiconductor substrate 100 on both sides of the gate structure 200 to remove a portion of the lightly doped region 301, a portion of the first halo region 302, and a non-implanted portion of the semiconductor substrate 100 to form a groove 401 (e.g., Step 130 of FIG. 10).

For example, the sidewall spacers 204 can be a single layer or a stacked layer, e.g., made of silicon oxide and/or silicon nitride. The sidewall spacers 204 can be used to protect the gate structure 200 and to define a distance between subsequently-formed source/drain and the gate structure.

In an exemplary embodiment, the semiconductor substrate 100 has a (100) crystal plane. The first groove 401 can be Σ-shaped. The groove 401 can be formed by, e.g., forming a U-shaped opening by a dry etching process in the semiconductor substrate on both sides of the gate structure, and etching along the opening by a wet etching process (e.g., using tetramethylammonium hydroxide (TMAH) solution) to form the Σ-shaped groove 401. Because the etching rate of TMAH solution along the (100) and (110) crystal planes is greater than the etching rate along the (111) crystal plane, a Σ-shaped groove can be formed. In other embodiments, any other suitable shapes can be used for the first groove 401 including, e.g., a U-shaped or V-shaped groove.

Figure 7:
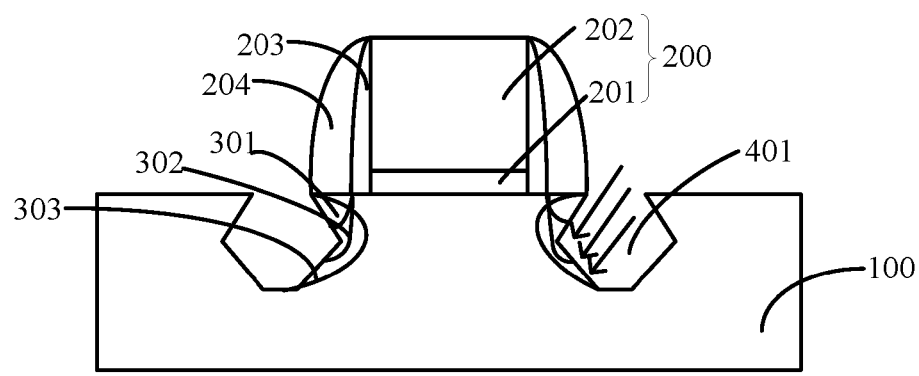

Referring to FIG. 7, a second halo region 303 is formed in the semiconductor substrate 100 by performing a second halo implantation through or into a sidewall of the groove 401 on the side that is adjacent to or near the gate structure 200 (e.g., Step 140 of FIG. 10). For example, when a PMOS transistor is to be formed, ions for the second halo implantation can be N-type ions such as As, P, etc. When an NMOS transistor is to be formed, ions for the second halo implantation can be C ions or P-type ions such as B, In, etc. An ion implanting energy of the second halo implantation can range from about 2 KeV to about 20 KeV with an ion implanting dose ranging from about 1E12 atom/cm$^2$ to about 1E14 atom/cm$^2$ at an ion implanting angle ranging from about 0 degree to about 40 degrees towards the sidewall of the groove 401 on the side near the gate structure 200. The implantation depth of the second halo implantation can range from about 5 nm to about 50 nm.

During formation of the groove 401, a portion of the first halo region 302 can be etched way to reduce the area of the first halo region 302, which weakens the diffusion barrier effect of the first halo region on the doped ions from the subsequently-formed source/drain. Further, because the depth of the formed source/drain is deeper than the depth of the first halo region 302, a sidewall portion of the groove 401 near the channel region is not completely enclosed or covered by the first halo region 302. As a result, the doped ions in the subsequently-formed source/drain can tend to diffuse into the channel region through the sidewall portion that is not enclosed or completely covered by the first halo region 302.

As disclosed herein, the second halo region 303 formed through the sidewall of the groove 401 near the channel region by the second halo implantation can repair the damage of the first halo region 302 during the formation of the groove 401 to increase the total area and depth of the halo region. Meanwhile, the second halo region 303 can enclose/cover a sidewall of the side of the groove 401 that is near the channel region since the second halo implantation is carried out into the sidewall of the groove 401 that is near the channel region 200. Accordingly, the blockage of ion diffusion from the source/drain is strengthened to reduce the source-drain punch-through effect.

In other embodiments, the first halo region 302 may not be formed, and the second halo implantation can be performed after the formation of the groove 401 to form a second halo region enclosing/covering the lightly doped region 301 and enclosing/covering the sidewall of the groove 401 near the gate structure. Compared to conventional methods, this second halo region will not be damaged in the subsequent processes, thus ensuring the blockage by the second halo region of ion diffusion from the source/drain.

A second annealing process is conducted after formation of the second halo region 303 to activate the doped ions in the second halo region 303. In an exemplary embodiment, a rapid thermal annealing process is used for the second annealing treatment at an annealing temperature ranging from about 950° C. to about 1150° C. for an annealing duration ranging from about 10 seconds to about 60 seconds.

In other embodiments, the second annealing treatment can be a spike annealing process at an annealing temperature ranging from about 800° C. to about 1060° C. for an annealing duration ranging from about 10 seconds to about 60 seconds.

In still other embodiments, the second annealing treatment can be a laser annealing process at an annealing temperature ranging from about 1200° C. to about 1350° C. for an annealing duration ranging from about 10 ms to about 60 ms.

In other embodiments, the first annealing treatment may not be performed after the light doped ion implantation and the first halo implantation, while the second annealing treatment is conducted after the second halo implantation. Meanwhile, the doped ions in the lightly doped region 301, the first halo region 302, and the second halo region 303 can be activated. The omission of the first annealing treatment with only the second annealing treatment can reduce times for annealing treatments, reduce cost on the thermal processes, and simplify the manufacturing process.

Figure 8:
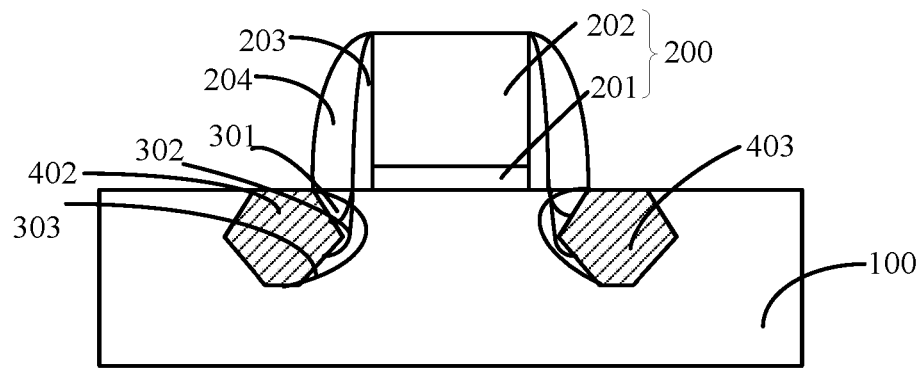

Referring to FIG. 8, a source 402 and a drain 403 are formed in the groove 401 (e.g., Step 150 of FIG. 10). The formation process of the source 402 and the drain 403 includes, e.g., forming a source/drain material layer in the groove 401 and heavily doping and annealing the source/drain material layer to form the source 402 and the drain 403 in the groove 401.

For example, when the transistor to be formed is a PMOS transistor, the source/drain material layer can be made of SiGe, heavily doped with C ions or P-type ions such as B and In. When the transistor to be formed is an NMOS transistor, the source/drain material layer can be made of SiC, heavily doped with N-type ions such as As and P. Application of SiGe or SiC as materials for the source/drain can generate stress in the channel region of the PMOS transistor or NMOS transistor, thus to improve carrier mobility in the channel region of the PMOS transistor or NMOS transistor to enhance transistor performance.

In an exemplary embodiment, the source/drain material layer is made of SiGe for a PMOS transistor. The source/drain material layer may include multiple layers including, e.g., a SiGe buffer layer on surface of inner wall of the groove 401; a SiGe bulk layer on surface of the SiGe buffer layer; and a covering layer on surface of the SiGe bulk layer. The SiGe buffer layer has a thickness of about 10 Å to about 200 Å; contains about 1% to about 20% of germanium; and is lightly doped or undoped. The SiGe bulk layer has a thickness of about 100 Å to about 500 Å; contains about 20% to about 40% of germanium; and is doped having an ion concentration of about 0 to about 2E20 atom/cm$^3$. The covering layer is made of lightly doped Si or SiGe, and/or undoped Si or SiGe.

A metal silicide layer is formed on the covering layer to reduce contact resistance between the source 402 and the drain 403. The lightly doped or undoped SiGe buffer layer formed first on the inner wall of the groove 401 can decrease diffusion of doped ions from the SiGe bulk layer to the channel region. In addition, due to the low content of Ge in the SiGe buffer layer, dislocation between the SiGe bulk layer and the semiconductor substrate is reduced to enhance the deposition quality of the source/drain SiGe bulk layer.

In an exemplary embodiment, after formation of a SiGe layer in the groove 401 (referring to FIG. 7), ion implantation of the SiGe layer can be performed to heavily dope the SiGe layer. In other embodiments, in situ doping/ion implantation can be applied during formation of the source/drain material layer to heavily dope the source/drain material layer. After that, an annealing process can also be conducted to activate the heavily doped ions.

Since the second halo implantation is performed prior to the formation of the source 402 and the drain 403, and the second halo region 302 is formed into the sidewall of the groove 401 near the channel region of transistor, and the second halo region 302 has an opposite conductivity type relative to the heavily doped source/drain material layer, the doped ions in the source/drain material layer can be prevented from being diffused into the channel region when annealing is performed to the heavily doped source/drain material layer.

Additionally, the width of depletion layer formed between the source/drain and the channel region can be reduced when the transistor is in operation, preventing interconnection of the depletion layer between the source/drain and the channel region to cause source-drain punch-through. Thus the short channel effect can be suppressed and transistor performance can be improved.

Figure 9:
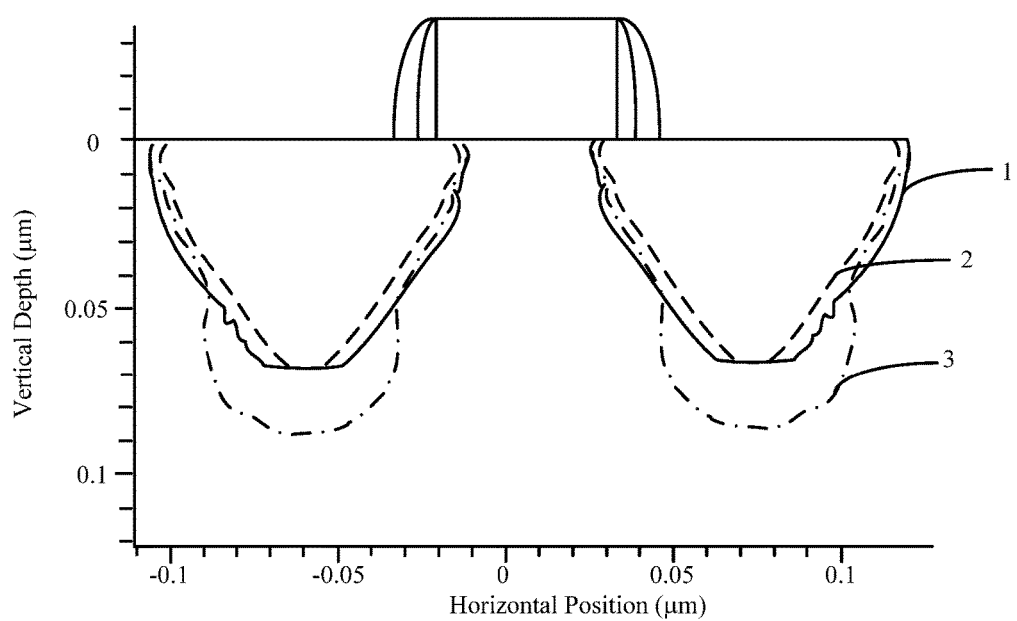
FIG. 9 shows isoconcentration plots of doped ions in source/drain of a conventional PMOS transistor and of a PMOS transistor consistent with the disclosed embodiments.

FIG. 9 shows isoconcentration plots of doped ions in source/drain of a conventional PMOS transistor and of a PMOS transistor consistent with the disclosed embodiments.

Specifically, plot 1 represents an exemplary isoconcentration line of doped ions in source/drain (doped with carbon ions) when a second halo ion implantation is performed in accordance with various embodiments. Carbon ions are implanted using an ion implanting energy of about 1 KeV and an ion implanting dose of about 1E14/cm$^2$.

Plot 2 represents another exemplary isoconcentration line of doped ions in source/drain (doped with carbon ions) when a second halo ion implantation is performed in accordance with various embodiments. In this example, carbon ions are implanted using an ion implanting energy of about 3 KeV and an ion implanting dose of about 3E14/cm$^2$.

Plot 3 represents an isoconcentration line of doped ions in source/drain (doped with carbon ions) without performing a second halo ion implantation as in conventional methods for forming transistors. The isoconcentration line of plot 3 defines a diffusion boundary of the doped ions in conventional source/drain region.

For plot 3, no second halo implantation is performed. The first halo region formed by the first halo implantation may be damaged (e.g., especially in the region near the bottom sidewall of the groove, almost no first halo region exists) during formation of the source groove. The doped ions near the bottom of the source/drain can be diffused more easily through the damaged or uncovered region and the source-drain punch-through may be generated in the channel region.

For plots 1 and 2, the second halo implantation is performed to form the second halo region in the source/drain groove near the channel region to repair the damage caused to the first halo region. Thus, after formation of the source/drain, diffusion of doped ions from the source/drain to the channel region is suppressed by the second halo region to effectively reduce the source drain punch-through effect. Additionally, the implantation depth in plot 2 is greater than the implantation depth in plot 1 due to a higher ion implanting energy for the plot 2. Therefore, the higher the ion implantation depth and/or the higher the dose, the better the diffusion of doped ions of the source/drain can be suppressed.

Other applications, advantages, alternations, modifications, or equivalents to the disclosed embodiments are obvious to those skilled in the art.

What is claimed is:

1. A MOS transistor, comprising:
   a semiconductor substrate;
   a gate structure disposed on the semiconductor substrate, the gate structure including a gate dielectric layer and a gate on the gate dielectric layer;
   a lightly doped region disposed in the semiconductor substrate on both sides of the gate structure;
   a first halo region covering the lightly doped region in the semiconductor substrate;
   a source/drain disposed in the semiconductor substrate and on the both sides of the gate structure; and
   a second halo region disposed in the semiconductor substrate under the gate, formed into the semiconductor substrate from a sidewall of the source/drain that is adjacent to the gate structure, wherein:
   the second halo region is overlapped with: substantially the lightly doped region and at least a portion of the first halo region, under the gate structure in the semiconductor substrate, wherein the second halo region encloses a bottom portion of the lightly doped region and a bottom portion of the first halo region, and exposes an upper portion of the lightly doped region and an upper portion of the first halo region to the semiconductor substrate under the gate structure, and
   the first and second halo regions and the lightly doped region together are formed next to on the same sidewall of the source/drain adjacent under the gate structure.

2. The transistor of claim 1, wherein the second halo region is a barrier region used to block ion diffusion from the source/drain to a channel region of the MOS transistor.

3. The transistor of claim 1, wherein the source/drain is Σ-shaped, U-shaped, or V-shaped.

4. The transistor of claim 1, wherein the lightly doped region has a conductivity type opposite to the first and second halo regions.

5. The transistor of claim 1, wherein the second halo region has a conductivity type opposite to the source/drain.

6. The transistor of claim 1, wherein the second halo region has a depth ranging from about 5 nm to about 50 nm.

7. The transistor of claim 1, wherein the MOS transistor is a PMOS transistor, and the source/drain is made of a material of SiGe.

8. The transistor of claim 1, wherein the MOS transistor is an NMOS transistor, and the source/drain is made of a material of SiC.

9. The transistor of claim 1, wherein a depth of the source/drain is deeper than a depth of each of the first and second halo regions.

10. The transistor of claim 1, wherein the second halo region encloses the sidewall of the source/drain adjacent under the gate structure.

11. The transistor of claim 1, wherein the second halo region encloses completely the sidewall of the source/drain adjacent under the gate structure.

* * * * *